US011876025B2

(12) United States Patent
Yang

(10) Patent No.: US 11,876,025 B2
(45) Date of Patent: Jan. 16, 2024

(54) SEMICONDUCTOR STRUCTURE

(71) Applicant: NANYA TECHNOLOGY CORPORATION, New Taipei (TW)

(72) Inventor: Tsang-Po Yang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 191 days.

(21) Appl. No.: 17/538,014

(22) Filed: Nov. 30, 2021

(65) Prior Publication Data

US 2022/0084897 A1 Mar. 17, 2022

Related U.S. Application Data

(62) Division of application No. 17/008,963, filed on Sep. 1, 2020, now Pat. No. 11,393,731.

(51) Int. Cl.
*H01L 21/66* (2006.01)
*H01L 29/417* (2006.01)

(52) U.S. Cl.
CPC ........ *H01L 22/34* (2013.01); *H01L 29/41775* (2013.01)

(58) Field of Classification Search
CPC ........................ H01L 22/34; H01L 29/41775
See application file for complete search history.

(56) References Cited

U.S. PATENT DOCUMENTS

| 4,896,108 A | 1/1990 | Lynch et al. |
| 2001/0035762 A1 | 11/2001 | Shida |
| 2003/0006795 A1 | 1/2003 | Asayama et al. |
| 2006/0157700 A1 | 7/2006 | Winter et al. |
| 2007/0236237 A1* | 10/2007 | Kuo ........................ H01L 22/14 257/E21.531 |
| 2007/0257258 A1* | 11/2007 | Ikoma ..................... H01L 22/34 257/48 |
| 2013/0147510 A1* | 6/2013 | Huang ..................... H01L 22/34 257/48 |
| 2020/0161195 A1 | 5/2020 | Hsu |

FOREIGN PATENT DOCUMENTS

| KR | 100390826 B1 * | 7/2003 | ............. H01L 22/34 |
| TW | 200739778 A | 10/2007 | |

OTHER PUBLICATIONS

Shin, Yong-Uk, KR100390826B1, machine translation (Year: 2003).*
Office Action dated Jan. 10, 2022 related to U.S. Appl. No. 17/008,963, wherein this application is a DIV of U.S. Appl. No. 17/008,963.

* cited by examiner

*Primary Examiner* — Andres Munoz
(74) *Attorney, Agent, or Firm* — Xuan Zhang

(57) ABSTRACT

The present disclosure provides a semiconductor structure having a test structure. The semiconductor structure includes a wafer and a test structure disposed on the wafer. The test structure includes a first device having a first source/drain layer and a first gate layer disposed above the first source/drain layer; a second device, having a second source/drain layer and a second gate layer disposed above the second source/drain layer, the second gate layer connected to the first gate layer; a third device, disposed adjacent to the first device and having a third source/drain layer. The first gate layer is disposed above the third source/drain layer, and the first gate layer is disposed along a first direction and the second gate layer is disposed along a second direction orthogonal to the first direction.

14 Claims, 7 Drawing Sheets

SEMICONDUCTOR STRUCTURE

CROSS-REFERENCE TO RELATED APPLICATION

This application is a divisional application of U.S. Non-Provisional application Ser. No. 17/008,963 filed on Sep. 1, 2020, which is incorporated herein by reference in its entirety.

TECHNICAL FIELD

The present disclosure relates to a semiconductor structure, and more particularly, to a semiconductor structure having a test structure.

DISCUSSION OF THE BACKGROUND

In the process of producing memory devices, many steps are required to form the desired devices. In the process of forming a DRAM, for example, many steps are needed to form structures such as a capacitor and a transistor to build up a memory cell. To ensure the structures are correctly formed on a wafer by such steps, test structures are usually formed on the wafers.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure including a wafer and a test structure. The test structure is disposed on the wafer, and includes a first device and a second device. The first device includes a first source/drain layer and a first gate layer disposed above the first source/drain layer. The second device includes a second source/drain layer and a second gate layer disposed above the second source/drain layer. The second gate layer is connected to the first gate layer. The first gate layer is disposed along a first direction and the second gate layer is disposed along a second direction orthogonal to the first direction.

In some embodiments, the first source/drain layer and the second gate layer are separated by a first distance, the second source/drain layer and the first gate layer are separated by a second distance, and the first distance is greater than the second distance.

In some embodiments, the first distance is along a first direction and the second distance is along a second direction.

In some embodiments, the test structure further includes a third device. The third device is disposed adjacent to the second device and includes a third source/drain layer. The second gate layer is disposed above the third source/drain layer.

In some embodiments, the first source/drain layer and the second gate layer are separated by a first distance, the second source/drain layer and the third source/drain layer are separated by a second distance, and the first distance is greater than the second distance.

In some embodiments, the test structure further includes a third device. The third device is disposed adjacent to the first device and includes a third source/drain layer. The first gate layer is disposed above the third source/drain layer.

In some embodiments, the first source/drain layer and the third source/drain layer are separated by a first distance, the second source/drain layer and the first gate layer are separated by a second distance, and the first distance is greater than the second distance.

In some embodiments, the test structure is disposed in a scribe line of the wafer.

Another aspect of the present disclosure provides a semiconductor structure including a wafer and a test structure. The test structure is disposed on the wafer, and includes a first source/drain layer, a second source/drain layer and a gate layer. The gate layer includes a first portion and a second portion. The first portion is disposed above the first source/drain layer. The second portion is disposed above the second source/drain layer. The first portion is disposed along a first direction and the second portion is disposed along a second direction orthogonal to the first direction.

In some embodiments, the first source/drain layer and the second portion are separated by a first distance, the second source/drain layer and the first portion are separated by a second distance, and the first distance is greater than the second distance.

In some embodiments, the first distance is along the first direction and the second distance is along the second direction.

In some embodiments, the test structure further includes a third source/drain layer. The third source/drain layer is disposed adjacent to the second source/drain layer. The second portion of the gate layer is disposed above the third source/drain layer.

In some embodiments, the first source/drain layer and the second portion are separated by a first distance, the second source/drain layer and the third source/drain layer are separated by a second distance, and the first distance is greater than the second distance.

In some embodiments, the test structure further includes a third source/drain layer. The third source/drain layer is disposed adjacent to the first source/drain layer. The first portion of the gate layer is disposed above the third source/drain layer.

In some embodiments, the first source/drain layer and the third source/drain layer are separated by a first distance, the second source/drain layer and the first portion are separated by a second distance, and the first distance is greater than the second distance.

In some embodiments, the test structure is disposed in a scribe line of the wafer.

Another aspect of the present disclosure provides a semiconductor structure including a wafer and a test structure. The wafer includes a first scribe line and a second scribe line orthogonal to the first scribe line. The test structure is disposed in the first scribe line of the wafer and includes a first device and a second device. The first device includes a first gate layer along a first direction. The second device includes a second gate layer along a second direction orthogonal to the first direction. The second gate layer is connected to the first gate layer.

In some embodiments, the test structure further includes a third device. The third device is disposed adjacent to the second device. The second gate layer is disposed in the third device.

In some embodiments, the test structure further includes a third device. The third device is disposed adjacent to the first device. The first gate layer is disposed in the third device.

In some embodiments, the second device is disposed between the first device and the third device.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
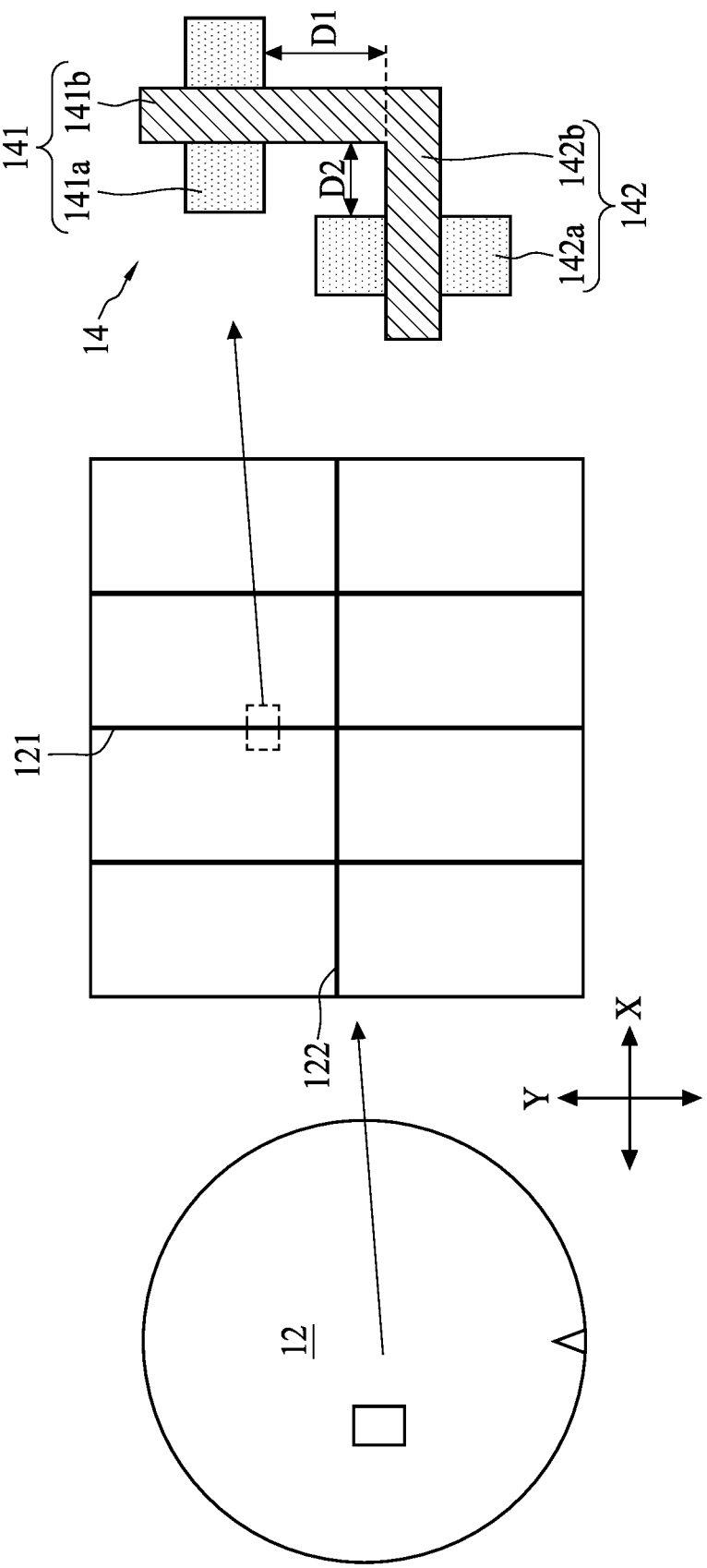
FIG. 1 is a top view of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be understood that similar features in FIGS. 3 to 7 are identified by the same reference numerals for clarity and simplicity. Furthermore, similar elements in FIGS. 3 to 7 can include similar materials, and thus repeated descriptions of such details are omitted in the interest of brevity.

In accordance with some embodiments of the present disclosure, FIG. 1 is a top view of a semiconductor structure 10. With reference to FIG. 1, in some embodiments, the semiconductor structure 10 includes a wafer 12 and a test structure 14.

In some embodiments, the wafer 12 may be made of semiconductor materials, and the wafer 12 may be, but is not limited to, bulk silicon, a semiconductor wafer, a silicon-on-insulator (SOI) wafer, or a silicon germanium wafer. Other semiconductor materials including group III, group IV, or group V elements may also be used. In some embodiments, the wafer includes a scribe line 121 and a scribe line 122. The scribe line 121 and the scribe line 122 are orthogonal to each other. In some embodiments, the scribe line 121 and the scribe line 122 are used for dicing the wafer 12 into a plurality of semiconductor devices (for example, chips).

In some embodiments, the test structure 14 is disposed on the wafer 12. In some embodiments, the test structure 14 is disposed in the scribe line 121 of the wafer 12. In other words, when the wafer 12 is diced into the plurality of semiconductor devices, the test structure 14 is removed during the dicing operation.

The test structure 14 includes a first device 141 and a second device 142. The first device 141 includes a source/drain layer 141a and a gate layer 141b. The gate layer 141b is disposed above the source/drain layer 141a. In some embodiments, the source/drain layer 141a is an N-doped layer or a P-doped layer in the wafer 12. It should be understood that the source/drain layer 141a may include a source region and a drain region in the wafer 12. In some embodiments, the gate layer 141b is made of semiconductor materials, and the gate layer 141b may be, but is not limited to, polysilicon. The gate layer 141b is disposed along a first direction Y.

The second device 142 includes a source/drain layer 142a and a gate layer 142b. The gate layer 142b is disposed above the source/drain layer 142a. In some embodiments, the source/drain layer 142a is an N-doped layer or a P-doped layer in the wafer 12. It should be understood that the source/drain layer 142a may include a source region and a drain region in the wafer 12. In some embodiments, the gate layer 142b is made of semiconductor materials, and the gate layer 142b may be, but is not limited to, polysilicon. The gate layer 142b is disposed along a second direction X. The first direction Y and the second direction X are orthogonal to each other. In some embodiments, the gate layer 142*b* is connected to the gate layer 141*b*. The gate layer 141*b* and the gate layer 142*b* may be formed in the same operation. In some embodiments, the gate layer 141*b* and the gate layer 142*b* are integrally formed. It should be understood that when the gate layers are integrally formed, the gate layer 141*b* may refer to a first portion and the gate layer 142*b* may refer to a second portion of the integrally-formed gate layer.

In some embodiments, the source/drain layer 141*a* and the gate layer 142*b* are separated by a first distance D1. In some embodiments, the source/drain layer 142*a* and the gate layer 141*b* are separated by a second distance D2. The first distance D1 may be greater than the second distance D2. In other embodiments, the first distance D1 may be less than the second distance D2.

In some embodiments, the gate layer 141*b* of the first device 141 disposed along the first direction Y may be used for testing the effect of a lattice direction difference between the gate layer 141*b* and the wafer 12. In other words, the lattice direction (for example, along the first direction Y) of the material (for example, polysilicon) of the gate layer 141*b* may be different from the lattice direction (for example, along the second direction X) of the material (for example, silicon) of the wafer 12. The lattice direction difference between the gate layer 141*b* and the wafer 12 may influence the electronic property of the first device 141.

In some embodiments, the second device 142 may be used for testing the effect of a dopant variation in the source/drain layer 142*a*. In contrast to the first device 141, the lattice direction (for example, along the second direction Y) of the material (for example, polysilicon) of the gate layer 142*b* may be the same as the lattice direction (for example, along the second direction X) of the material (for example, silicon) of the wafer 12, and thus no effect of the lattice direction difference may be observed in the second device 142. However, the dopant variation in the source/drain layer 142*a* of the second device 142 disposed along the second direction X may influence the electronic property of the second device 142 more than the lattice direction difference.

Figure 2:
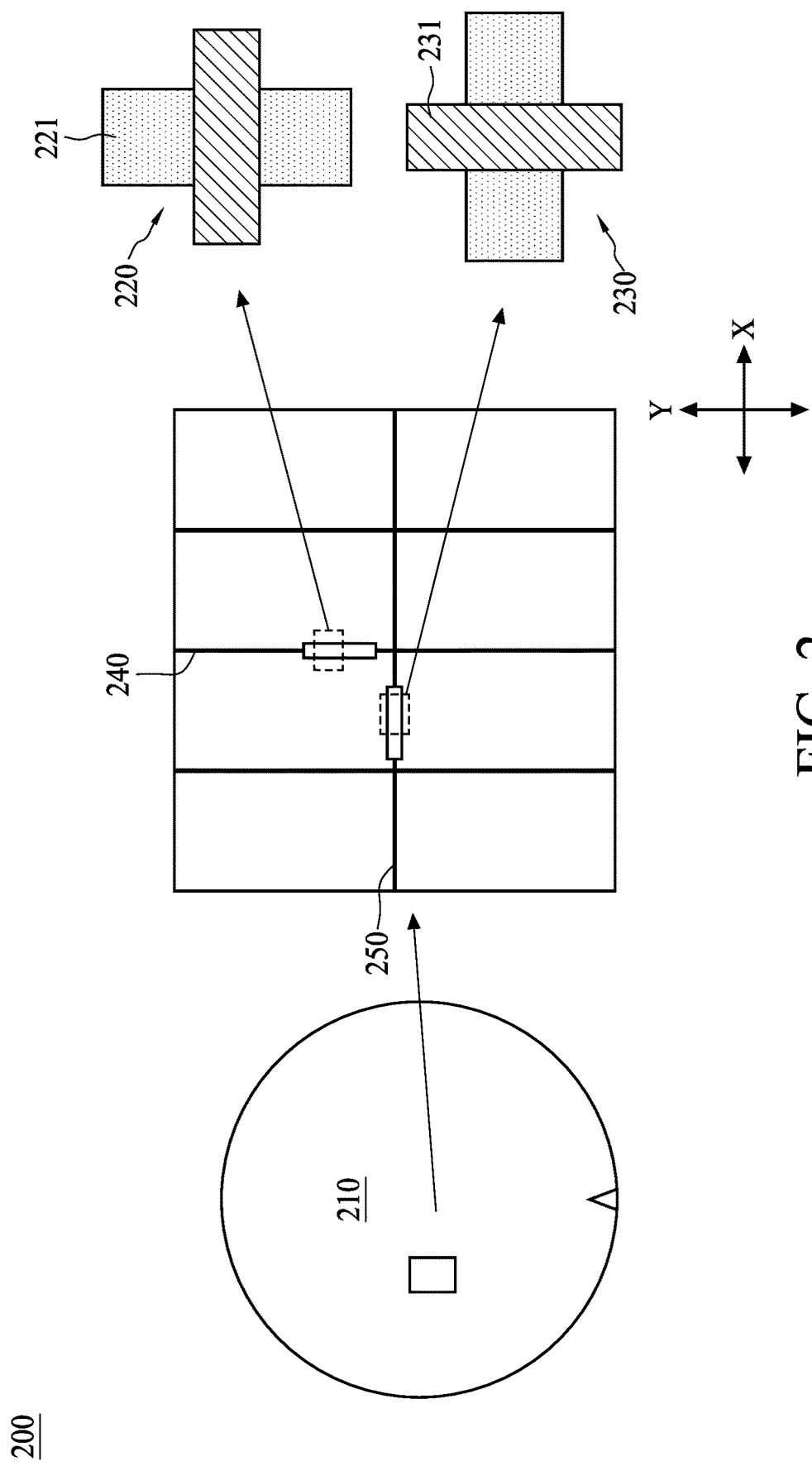
FIG. 2 is a top view of a conventional semiconductor structure.

FIG. 2 is a top view of a conventional semiconductor structure 200. With reference to FIG. 2, the semiconductor structure 200 includes a wafer 210, a first test structure 220 and a second test structure 230. The first test structure 220 is disposed in a scribe line 240 along the first direction Y. The second test structure 230 is disposed in a scribe line 250 along the second direction X. The scribe line 240 and the scribe line 250 are orthogonal to each other.

In the semiconductor structure 200, the first test structure 220 may be used for testing an effect of a dopant variation in a source/drain layer 221. The second test structure 230 may be used for testing an effect of a lattice direction difference between a gate layer 231 and the wafer 210. In the semiconductor structure 200, the first test structure 220 and the second test structure 230 are formed respectively in the different scribe lines 240 and 250. Thus, the testing operations for different purposes may need to be carried out separately. In other words, the tests for the effect of the dopant variation and for the effect of the lattice direction difference may need to be carried out in separate operations.

Referring back to FIG. 1, in contrast to the conventional semiconductor structure 200, the test structure 14 of the semiconductor structure 10 of the present disclosure includes the first device 141 and the second device 142. The first device 141 is used for testing the effect of a lattice direction difference between the gate layer 141*b* and the wafer 12, and the second device 142 is used for testing the effect of a dopant variation in the source/drain layer 142*a*. In other words, the test structure 14 of the present disclosure may be used for different testing purposes. The testing operations for the test structure 14 of the present disclosure may be carried out in the same operation. The efficiency of testing may be improved compared to that of the conventional semiconductor structure 200.

Figure 3:
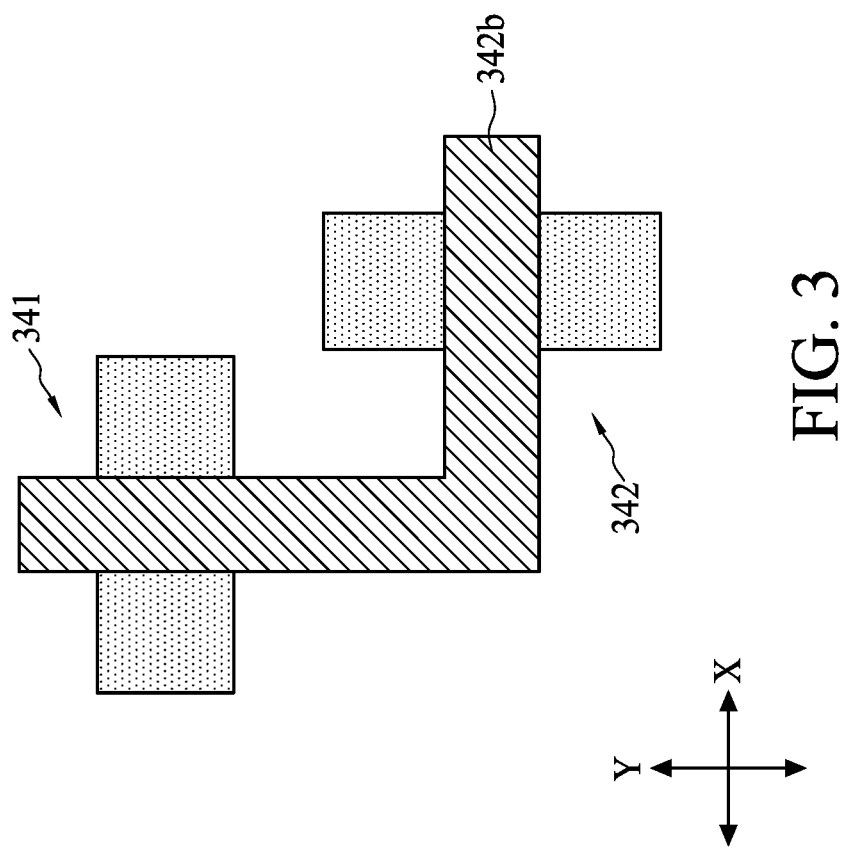
FIG. 3 is a top view of a semiconductor structure in accordance with some embodiments of the present disclosure.

In accordance with some embodiments of the present disclosure, FIG. 3 is a top view of a test structure 34. With reference to FIG. 3, in some embodiments, the test structure 34 includes a first device 341 and a second device 342. The first device 341 is similar to the first device 141 in FIG. 1 and repeated description is omitted here for brevity.

The difference between the test structure 34 in FIG. 3 and the test structure 14 in FIG. 1 is that a gate layer 342*b* of the second device 342 is disposed in a direction opposite to that of the gate layer 142*b* of the second device 142 in FIG. 1. The gate layer 342*b* is disposed along the second direction X toward the right (or positive direction) as seen in FIG. 3, while the gate layer 142*b* is disposed along the second direction X toward the left (or negative direction) as seen in FIG. 1.

In summary, the test structure 34 of the present disclosure includes the first device 341 and the second device 342 for different testing purposes. The testing operations for the test structure 34 of the present disclosure may be carried out in the same operation. The efficiency of testing may be improved compared to that of the conventional semiconductor structure 200 in FIG. 2. Moreover, the gate layer 342*b* of the second device 342 may be disposed along a different direction corresponding to the first device 341 for increasing the design freedom.

Figure 4:
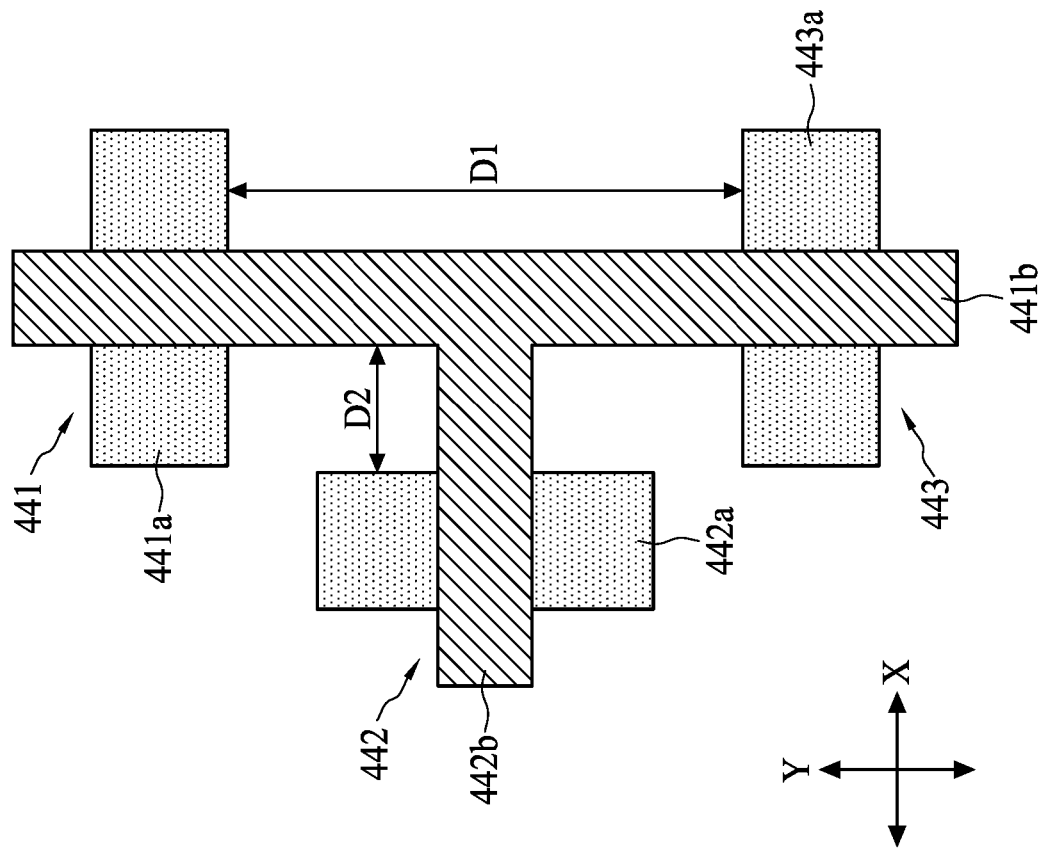
FIG. 4 is a top view of a semiconductor structure in accordance with some embodiments of the present disclosure.

In accordance with some embodiments of the present disclosure, FIG. 4 is a top view of a test structure 44. With reference to FIG. 4, in some embodiments, the test structure 44 includes a first device 441, a second device 442 and a third device 443. The first device 441 and the second device 442 are similar to the first device 141 and the second device 142 in FIG. 1 and repeated description is omitted here for brevity.

The difference between the test structure 44 in FIG. 4 and the test structure 14 in FIG. 1 is that the test structure 44 includes the third device 443 disposed adjacent to the first device 441 and the second device 442. The third device 443 includes a source/drain layer 443*a*, and a gate layer 441*b* of the first device 441 is disposed above the source/drain layer 443*a*. In some embodiments, the second device 442 is disposed between the first device 441 and the third device 443.

In some embodiments, a source/drain layer 441*a* and the source/drain layer 443*a* are separated by a first distance D1. In some embodiments, a source/drain layer 442*a* and the gate layer 441*b* are separated by a second distance D2. In some embodiments, the first distance D1 may be greater than the second distance D2. In other embodiments, the first distance D1 may be less than the second distance D2.

In summary, the test structure 44 of the present disclosure includes the first device 441, the second device 442 and the third device 443 for different testing purposes. The testing operations for the test structure 44 of the present disclosure may be carried out in the same operation. The efficiency of testing may be improved compared to that of the conventional semiconductor structure 200 in FIG. 2. Moreover, the first device 441 and the third device 443 may further be used for testing the effect of a lattice direction difference between two adjacent devices.

Figure 5:
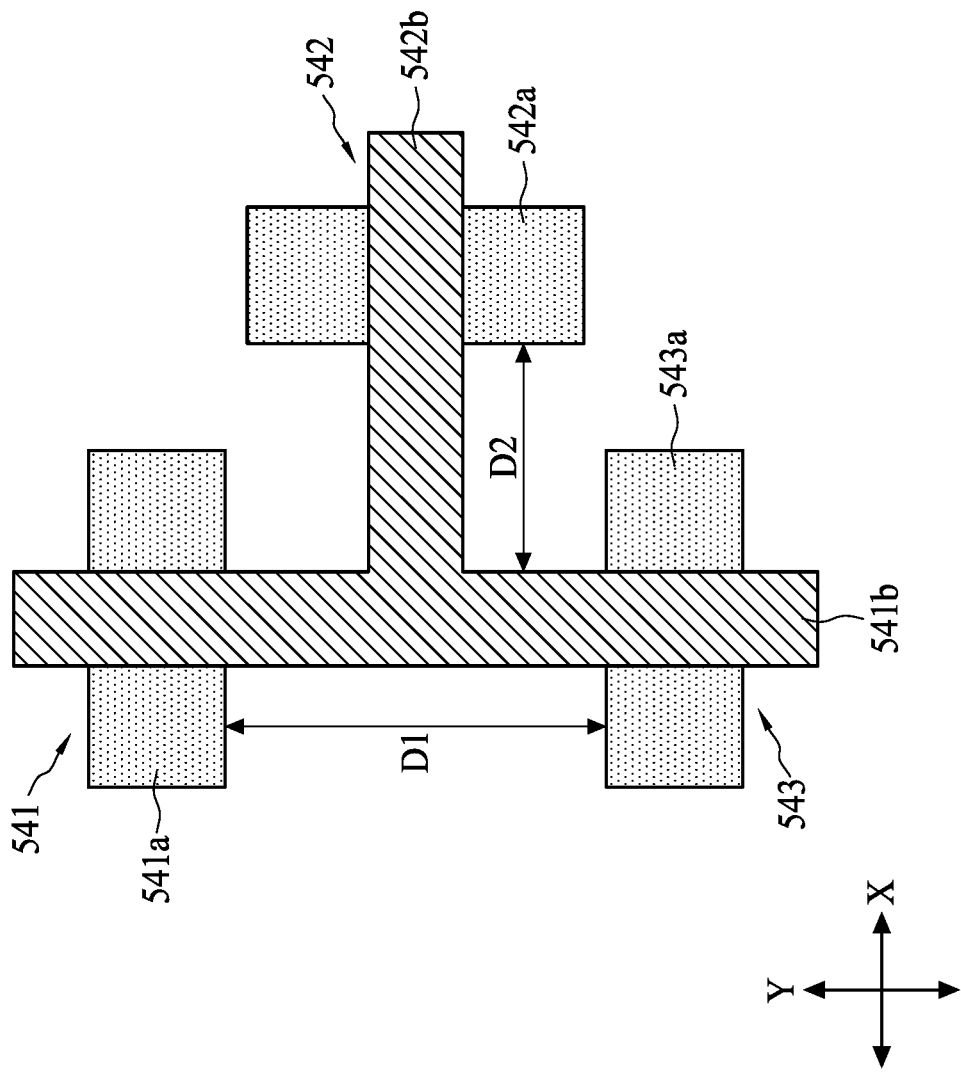
FIG. 5 is a top view of a semiconductor structure in accordance with some embodiments of the present disclosure.

In accordance with some embodiments of the present disclosure, FIG. 5 is a top view of a test structure 54. With reference to FIG. 5, in some embodiments, the test structure 54 includes a first device 541, a second device 542 and a third device 543. The first device 541 and the third device 543 are similar to the first device 441 and the third device 443 in FIG. 4 and repeated description is omitted here for brevity. In some embodiments, a first distance D1 (i.e., a distance between a source/drain layer 541a and a source/drain layer 543a) is greater than a second distance D2 (i.e., a distance between a source/drain layer 542a and a gate layer 541b). In other embodiments, the first distance D1 may be less than the second distance D2.

The difference between the test structure 54 and the test structure 44 in FIG. 4 is that a gate layer 542b of the second device 542 is disposed in a direction opposite to that of the gate layer 442b of the second device 442 in FIG. 4. The gate layer 542b is disposed along the second direction X toward the right (or positive direction) as seen in FIG. 5, while the gate layer 442b is disposed along the second direction X toward the left (or negative direction) as seen in FIG. 4.

In summary, the test structure 54 of the present disclosure includes the first device 541, the second device 542 and the third device 543 for different testing purposes. The testing operations for the test structure 54 of the present disclosure may be carried out in the same operation. The efficiency of testing may be improved compared to that of the conventional semiconductor structure 200 in FIG. 2. The first device 541 and the third device 543 may further be used for testing the effect of a lattice direction difference between two adjacent devices. Moreover, the gate layer 542b of the second device 542 may be disposed along a different direction corresponding to the first device 541 and the third device 543 for increasing the design freedom.

Figure 6:
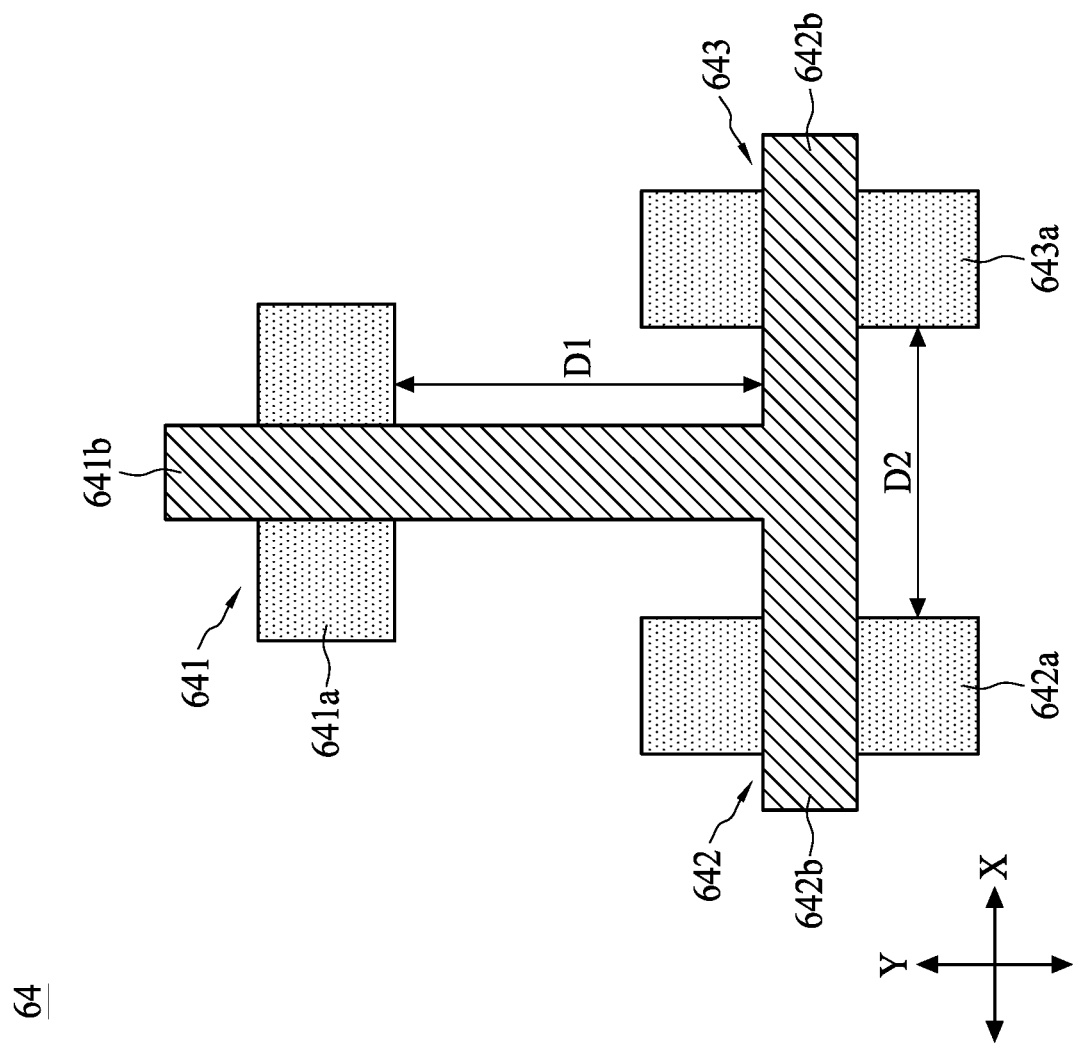
FIG. 6 is a top view of a semiconductor structure in accordance with some embodiments of the present disclosure.

In accordance with some embodiments of the present disclosure, FIG. 6 is a top view of a test structure 64. With reference to FIG. 6, in some embodiments, the test structure 64 includes a first device 641, a second device 642 and a third device 643. The first device 641 and the second device 642 are similar to the first device 141 and the second device 142 in FIG. 1 and repeated description is omitted here for brevity. In some embodiments, a first distance D1 (i.e., a distance between a source/drain layer 641a and a gate layer 642b) is greater than a second distance D2 (i.e., a distance between a source/drain layer 642a and a source/drain layer 643a). In other embodiments, the first distance D1 may be less than the second distance D2.

The difference between the test structure 64 and the test structure 14 in FIG. 1 is that the test structure 64 includes the third device 643 disposed adjacent to the first device 641 and the second device 642. The third device 643 includes a source/drain layer 643a, and a gate layer 642b of the second device 642 is disposed above the source/drain layer 643a. In other words, the second device 642 and the third device 643 are formed with the same gate layer 642b. In some embodiments, the first device 641 is disposed between the second device 642 and the third device 643.

In summary, the test structure 64 of the present disclosure includes the first device 641, the second device 642 and the third device 643 for different testing purposes. The testing operations for the test structure 64 of the present disclosure may be carried out in the same operation. The efficiency of testing may be improved compared to that of the conventional semiconductor structure 200 in FIG. 2. Moreover, the second device 642 and the third device 643 may further be used for testing the effect of a dopant variation in the source/drain layer 642a and 643a between two adjacent devices.

Figure 7:
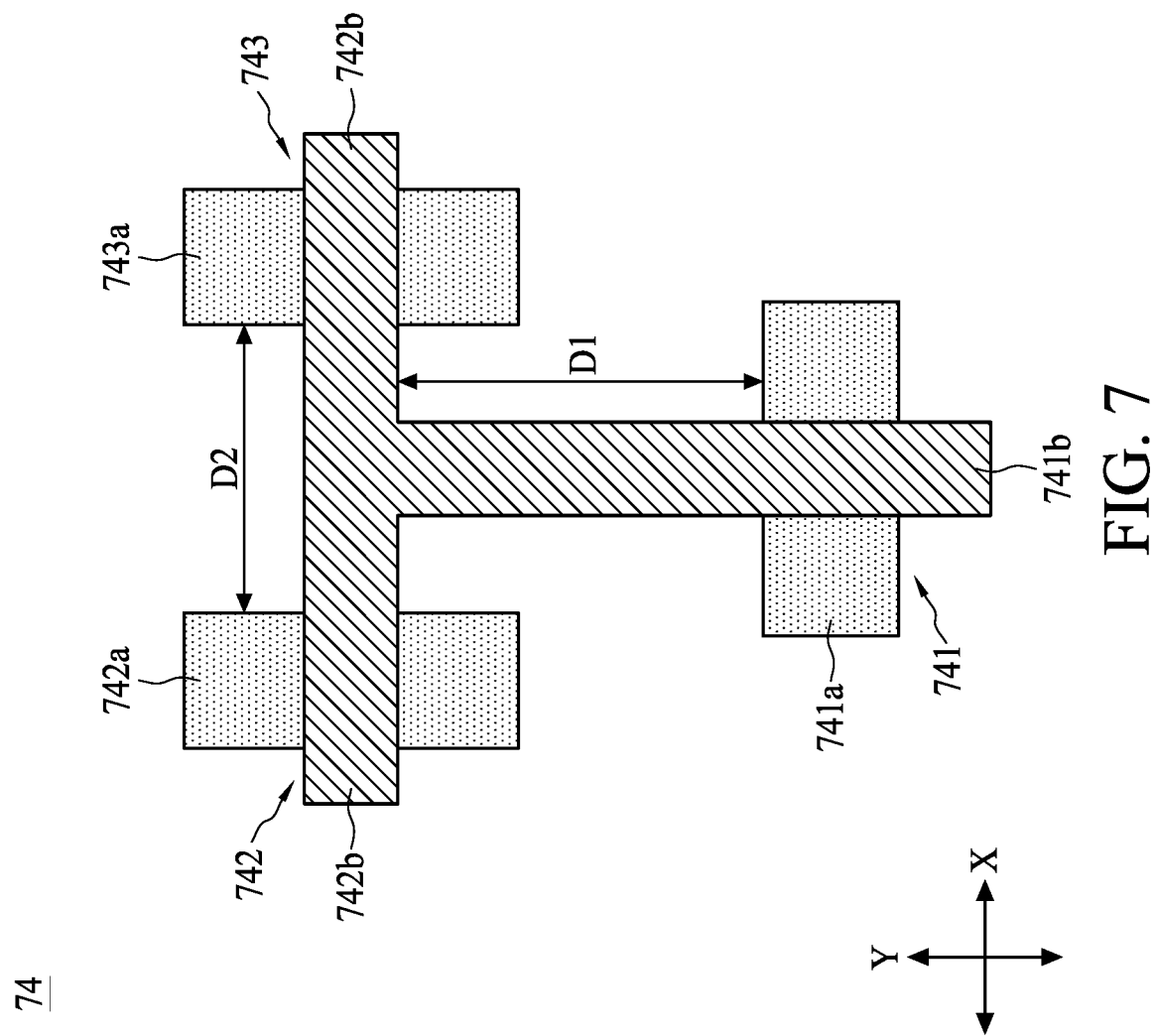
FIG. 7 is a top view of a semiconductor structure in accordance with some embodiments of the present disclosure.

In accordance with some embodiments of the present disclosure, FIG. 7 is a top view of a test structure 74. With reference to FIG. 7, in some embodiments, the test structure 74 includes a first device 741, a second device 742 and a third device 743. The first device 741 and the second device 742 are similar to the first device 641 and the second device 642 in FIG. 6 and repeated description is omitted here for brevity. In some embodiments, a first distance D1 (i.e., a distance between a source/drain layer 741a and a gate layer 742b) is greater than a second distance D2 (i.e., a distance between a source/drain layer 742a and a source/drain layer 743a). In other embodiments, the first distance D1 may be less than the second distance D2.

The difference between the test structure 74 in FIG. 7 and the test structure 14 in FIG. 1 is that a gate layer 741b of the first device 741 is disposed in a direction opposite to that of the gate layer 641b of the first device 641 in FIG. 6. The gate layer 741b is disposed along a direction Y upward (or positive direction) in FIG. 7 and the gate layer 641b is disposed along a direction Y downward (or negative direction) in FIG. 6.

In summary, the test structure 74 of the present disclosure includes the first device 741, the second device 742 and the third device 743 for different testing purposes. The testing operations for the test structure 74 of the present disclosure may be carried out in the same operation. The efficiency of testing may be improved compared to that of the conventional semiconductor structure 200 in FIG. 2. The second device 742 and the third device 743 may further be used for testing the effect of a dopant variation in the source/drain layer 742a and 743a between two adjacent devices. Moreover, the gate layer 741b of the first device 741 may be disposed along a different direction corresponding to the second device 742 and the third device 743 for increasing the design freedom.

It should be understood that the test structures in FIG. 1, FIG. 3, FIG. 4, FIG. 5, FIG. 6, and FIG. 7 may be combined to form different patterns.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor structure, comprising:
   a wafer; and
   a test structure, disposed on the wafer and comprising:

a first device, comprising a first source/drain layer and a first gate layer disposed above the first source/drain layer, wherein the first source/drain layer is disposed between two free ends of the first gate layer, wherein the first gate layer has a uniform width between the two free ends thereof;

a second device, comprising a second source/drain layer and a second gate layer disposed above the second source/drain layer, the second gate layer having a connecting end connected to the first gate layer and a free end, wherein the second source/drain layer is disposed between the connecting end and the free end of the second gate layer, wherein the second gate layer has a uniform width between the connecting end and the free end; and a third device, disposed adjacent to the first device and comprising a third source/drain layer, wherein the first source/drain layer, the second source/drain layer, and the third source/drain layer are spaced apart from each other and are independent from each other;

wherein the first gate layer is disposed above the third source/drain layer at a position that the third source/drain layer is disposed between the two free ends of the first gate layer;

wherein the first gate layer is disposed along a first direction and the second gate layer is disposed along a second direction orthogonal to the first direction;

wherein the first source/drain layer and the third source/drain layer are separated by a first distance along the first direction;

wherein the second source/drain layer and the first gate layer are separated by a second distance along the second direction;

wherein the first distance is greater than the second distance.

2. The semiconductor structure of claim 1, wherein the first source/drain layer and the third source/drain layer are parallel to each other.

3. The semiconductor structure of claim 2, wherein the connecting end of the second gate layer is integrally connected to a mid-portion of the first gate layer between the two free ends thereof to form a T-shaped configuration.

4. The semiconductor structure of claim 3, wherein the second source/drain layer is spacedly positioned between the first source/drain layer and the third source/drain layer and is separated from the first source/drain layer and the third source/drain layer, wherein the first source/drain layer, the second source/drain layer, and the third source/drain layer are spaced apart from each other in a contactless manner.

5. The semiconductor structure of claim 4, wherein the test structure is disposed in a scribe line of the wafer.

6. The semiconductor structure of claim 1, wherein the first source/drain layer is positioned perpendicular to the first gate layer, wherein the second source/drain layer is positioned perpendicular to the second gate layer, wherein the third source/drain layer is positioned perpendicular to the first gate layer.

7. A semiconductor structure, comprising:
a wafer; and
a test structure, disposed on the wafer and comprising:
a first source/drain layer;
a second source/drain layer; and
a gate layer, which has a T-shaped configuration, having a first portion and a second portion, the first portion disposed above the first source/drain layer, and the second portion disposed above the second source/drain layer, wherein the first portion has two free ends and has a uniform width between the two free ends thereof, wherein the second portion has a connecting end and an opposed free end, and has a uniform width between the connecting end and the free end;

wherein the first source/drain layer is disposed between two free ends of the first portion of the gate layer;

wherein the second source/drain layer is disposed between the connecting end and the free end of the second portion of the gate layer;

wherein the first portion is disposed along a first direction and the second portion is disposed along a second direction orthogonal to the first direction, wherein the connecting end of the second portion is integrated with a mid-portion of the first portion between the two free ends thereof to form the T-shaped configuration;

a third source/drain layer, disposed adjacent to the first source/drain layer, wherein the first source/drain layer, the second source/drain layer, and the third source/drain layer are spaced apart from each other and are independent from each other;

wherein the first portion of the gate layer is disposed above the third source/drain layer at a position that the third source/drain layer is disposed between the two free ends of the first portion of the gate layer.

8. The semiconductor structure of claim 7, wherein the first source/drain layer and the second portion are separated by a first distance, the second source/drain layer and the first portion are separated by a second distance, and the first distance is greater than the second distance, wherein the second source/drain layer is separated from the first source/drain layer and the third source/drain layer, wherein the first source/drain layer, the second source/drain layer, and the third source/drain layer are spaced apart from each other in contactless manner.

9. The semiconductor structure of claim 8, wherein the first distance is along the first direction and the second distance is along the second direction.

10. The semiconductor structure of claim 7, wherein a length of the first portion is larger than a length of the second portion.

11. The semiconductor structure of claim 7, wherein the first source/drain layer and the third source/drain layer are separated by a first distance, the second source/drain layer and the first portion are separated by a second distance, and the first distance is greater than the second distance.

12. The semiconductor structure of claim 7, wherein the test structure is disposed in a scribe line of the wafer.

13. A semiconductor structure, comprising:
a wafer, comprising a first scribe line and a second scribe line orthogonal to the first scribe line; and
a test structure, disposed in the first scribe line of the wafer and comprising:
a first device, comprising a first gate layer along a first direction, wherein the first gate layer has two free ends, and has a uniform width between the two free ends thereof; and
a second device, comprising a second gate layer along a second direction orthogonal to the first direction, wherein the second gate layer has a connecting end and an opposed free end, wherein the second gate layer has a uniform width between the connecting end and the free end;
a third device, disposed adjacent to the first device, wherein the first gate layer is disposed in the third device at a position that the third device is disposed between the two free ends of the first gate layer, the first device, the second device, and the third device are spaced apart from each other and are independent from each other;

wherein the connecting end of the second gate layer is integrally connected to a mid-portion of the first gate layer between the two free ends thereof to form a T-shaped configuration, wherein a length of the first gate layer is larger than a length of the second gate layer.

14. The semiconductor structure of claim 13, wherein the second device is spacedly disposed between the first device and the third device, wherein the second device is separated from the first device and the third device, wherein the first device, the second device, and the third device are spaced apart from each other in contactless manner.

* * * * *